United States Patent
Huang et al.

(10) Patent No.: US 8,222,112 B2
(45) Date of Patent: Jul. 17, 2012

(54) METHOD FOR MANUFACTURING NAND MEMORY CELLS

(75) Inventors: Chun-Sung Huang, Changhua County (TW); Ping-Chia Shih, Hsin-Chu (TW); Chiao-Lin Yang, Taichung County (TW); Chi-Cheng Huang, Kaohsiung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/114,045

(22) Filed: May 24, 2011

(65) Prior Publication Data

US 2011/0220988 A1 Sep. 15, 2011

Related U.S. Application Data

(62) Division of application No. 12/368,223, filed on Feb. 9, 2009, now Pat. No. 7,973,353.

(51) Int. Cl.
 *H01L 29/792* (2006.01)
 *H01L 21/336* (2006.01)

(52) U.S. Cl. .......... 438/287; 257/E21.423; 257/E29.309

(58) Field of Classification Search .................. 438/287; 257/E21.423, E29.309
See application file for complete search history.

(56) References Cited

U.S. PATENT DOCUMENTS

| 6,713,834 | B2 | 3/2004 | Mori |
| 6,746,918 | B2 | 6/2004 | Wu |
| 7,348,236 | B2 | 3/2008 | Abbott et al. |
| 2005/0285178 | A1 | 12/2005 | Abbott |

*Primary Examiner* — David S Blum
(74) *Attorney, Agent, or Firm* — Winston Hsu; Scott Margo

(57) ABSTRACT

A method for manufacturing NAND memory cells includes providing a substrate having a first doped region formed therein; forming a first dielectric layer, a storage layer and a patterned hard mask on the substrate; forming a STI in the substrate through the patterned hard mask and removing the patterned hard mask to define a plurality of recesses; forming a second dielectric layer and a first conductive layer filling the recesses on the substrate; and performing a planarization process to remove a portion of the first conductive layer and the second dielectric layer to form a plurality of self-aligned islanding gate structures.

15 Claims, 6 Drawing Sheets

METHOD FOR MANUFACTURING NAND MEMORY CELLS

CROSS REFERENCE TO RELATED APPLICATIONS

This application is a division of U.S. application Ser. No. 12/368,223, now U.S. Pat. No. 7,973,353, filed on Feb. 9, 2009, and incorporated herein by reference in its entirety.

BACKGROUND OF THE INVENTION

1. Field of the Invention

The present invention relates to NAND memory cells, and more particularly, to NAND memory cells having islanding gate structures and manufacturing method thereof.

2. Description of the Prior Art

Non-volatile memory devices have been commercially used nowadays. The non-volatile memory device comprises mask read-only memory (Mask ROM), programmable read-only memory (PROM), erasable programmable read-only memory (EPROM), electrically erasable programmable read-only memory (EEPROM), and Flash Memory. A NAND flash memory device is a common type of the flash memory device.

With a trend toward miniaturization of the semiconductor industry, it is getting more and more difficult yet critical to precisely control the line width of the word lines and the line space between each two adjacent word lines of a NAND memory cell array.

SUMMARY OF THE INVENTION

It is therefore a primary objective of the present invention to provide a method for manufacturing NAND memory cells to overcome problems in the prior art.

According to the claimed invention, a method for manufacturing NAND memory cells is provided. The method includes providing a substrate having a first doped region formed therein; forming a first dielectric layer, a storage layer and a patterned hard mask on the substrate; forming a shallow trench isolation (STI) in the substrate through the patterned hard mask and removing the patterned hard mask to define a plurality of recesses; forming a second dielectric layer and a first conductive layer filling the recesses on the substrate; and performing a planarization process to remove a portion of the first conductive layer and the second dielectric layer to form a plurality of self-aligned islanding gate structures.

According to the claimed invention, a NAND memory cell is further provided. The NAND memory cell includes a substrate having a shallow trench isolation (STI) formed therein; an islanding gate structure having a first dielectric layer, a storage layer, a second dielectric layer and a conductive layer sequentially stacked on the substrate; and a source/drain formed in the substrate at two opposite sides of the islanding gate structure; wherein the islanding gate structure is surrounded by the STI.

According to the provided invention, a NAND memory cell having an islanding gate structure surrounded by the STI is formed by the method for manufacturing NAND memory cells. More important, the conductive layer serving as control-gate or select gate of the islanding gate structure of the NAND memory cell is formed in a self-aligned manner after performing the planarization process. Therefore no high-grade photomask for defining the control-gate is needed, and no alignment and patterning are needed either. And thus the undesired misalignment and unsuccessful patterning occurred in the prior art and the resulting adverse influences are both fundamentally prevented.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 7 is a top plane view of the NAND memory provided by the presented method and FIG. 6 is the cross-sectional view taken along a line B-B' of FIG. 7;

DETAILED DESCRIPTION

Figure 1:
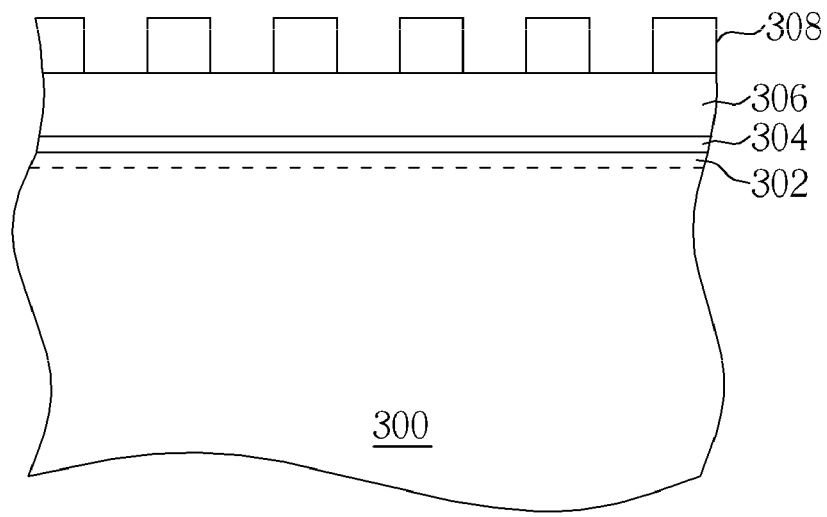
FIGS. 1-6 are schematic drawings illustrating the method for manufacturing NAND memory cells according to a first preferred embodiment of the present invention.

Please refer to FIGS. 1-6, which are schematic drawings illustrating the method for manufacturing NAND memory cells according to a first preferred embodiment of the present invention. It is to be understood that the drawings are not drawn to scale and are served only for illustration purposes. As shown in FIG. 1, a semiconductor substrate 300, such as a silicon substrate or a silicon-on-insulator (SOI) substrate is first provided. A blanket implantation is performed to form a first doped region 302 in the substrate 300, particularly in a surface of the substrate 300. Then, a first dielectric layer 304 is formed on the substrate 300. The first dielectric layer 304 is preferably a silicon oxide layer, a silicon nitride layer or an oxide-nitride-oxide multilayer. A storage layer 306 such as a doped poly-silicon layer exemplarily deposited by low pressure chemical vapor deposition (LPCVD) is formed on the first dielectric layer 304. However, the storage layer 306 may be a dielectric layer if required. Then a patterned hard mask 308 is formed on the storage layer 306. The patterned hard mask 308 exemplarily possesses an islanding pattern. It is noteworthy that adjustment and modification of the materials used to form the above-mentioned layers, thickness of the layers, or the methods for forming those layers are conceivable and not limited to this.

Figure 2:
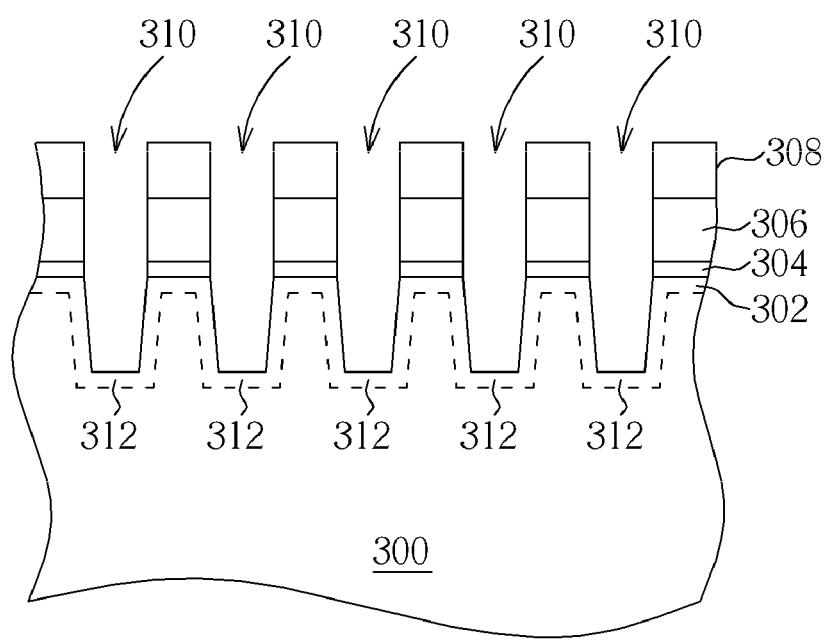

Please refer to FIG. 2. A step of etching the storage layer 306, the first dielectric layer 304 and the substrate 300 is performed to form a shallow trench 310 exemplarily in a grid pattern through the patterned hard mask 308. Then, an ion implantation is performed with a photomask (not shown) to form a plurality of second doped regions 312 in the substrate 300. It is noteworthy that the first doped region 302 and the second doped regions 312 construct a plurality of bit lines parallel to each other (shown in FIG. 7).

Figure 3:
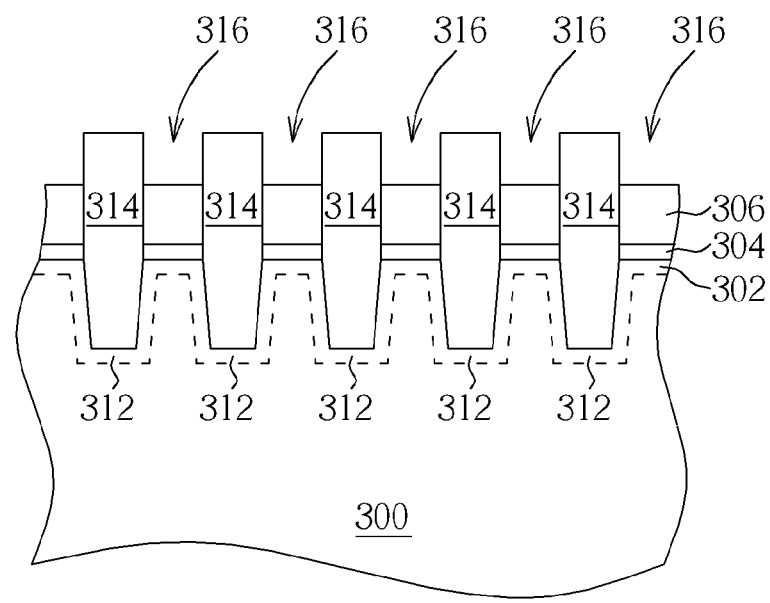

Please refer to FIG. 3. An insulating layer filling the shallow trench 310 is formed on the substrate 300. The insulating layer includes silicon oxide, phosphorous-silicate glass (p-glass), borophosphorous-silicate glass (BP-glass) as deposited by LPCVD, high-density plasma (HDP) CVD or plasma-enhanced (PE) CVD. Then, a chemical-mechanical polishing (CMP) process is performed to remove a portion of the insulating layer and to form the STI 314 with the patterned hard mask 308 serving as a polishing stop layer. After forming the STI 314, a step of removing the patterned hard mask 308 is performed, and thus a plurality of recesses 316 defined by the STI 314 are obtained while the STI 314 is formed to provide electrical isolation. In other words, the storage layer 306 constructs bottoms of the recesses 316; and the STI 314 constructs sidewalls of the recesses 316, as shown in FIG. 3.

Figure 4:
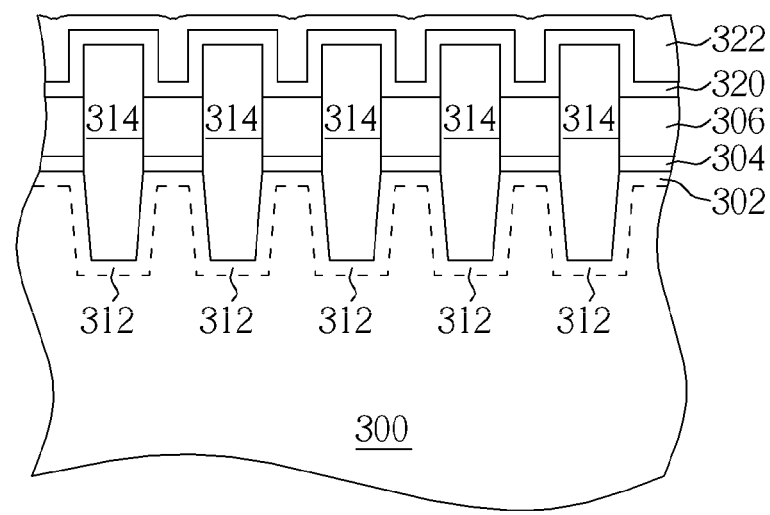

Please refer to FIG. 4. Next, a second dielectric layer 320 and a first conductive layer 322 filling the recesses 316 are sequentially formed on the substrate 300. The second dielectric layer 320 can be a silicon oxide layer, a silicon nitride layer or an oxide-nitride-oxide multilayer, and the first conductive layer 322 is preferably made of doped poly-silicon.

Figure 5:
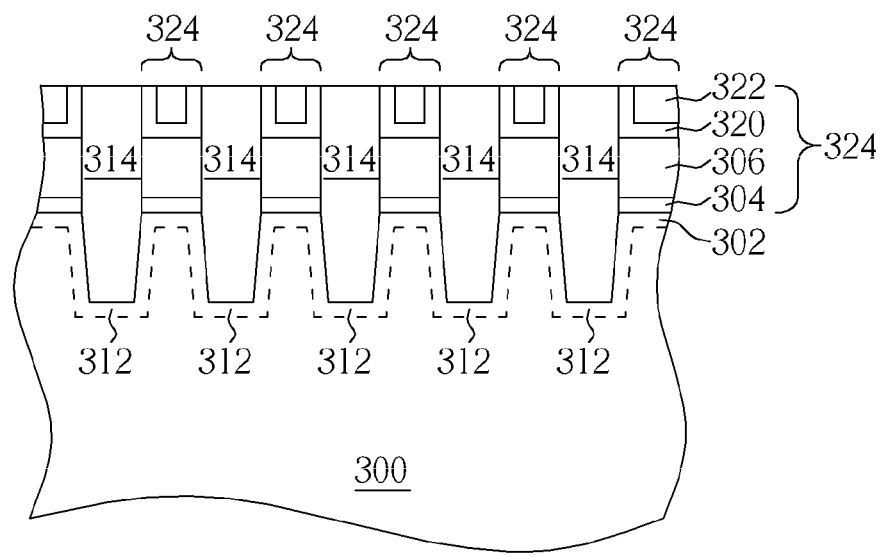

Please refer to FIG. 5. A planarization process such as a CMP process is performed to remove a portion of the first conductive layer 322 and the second dielectric layer 320 to form a plurality of self-aligned islanding gate structures 324. The first conductive layer 322 serves as a control-gate or select gate of a NAND memory cell in the first preferred embodiment. It is noteworthy a thickness of the first conductive layer 322 is approximately equal to a step-height between the STI 314 and the storage layer 306. In other words, top surfaces of the islanding gate structures 324 and a top surface of the STI 314 are substantially co-planar. Preferably, top surfaces of the islanding gate structures 324 are arranged to be a little higher than the top surface of the STI 314 so as to reduce an electrical resistance to connect the islanding gate structures 324.

Figure 6:
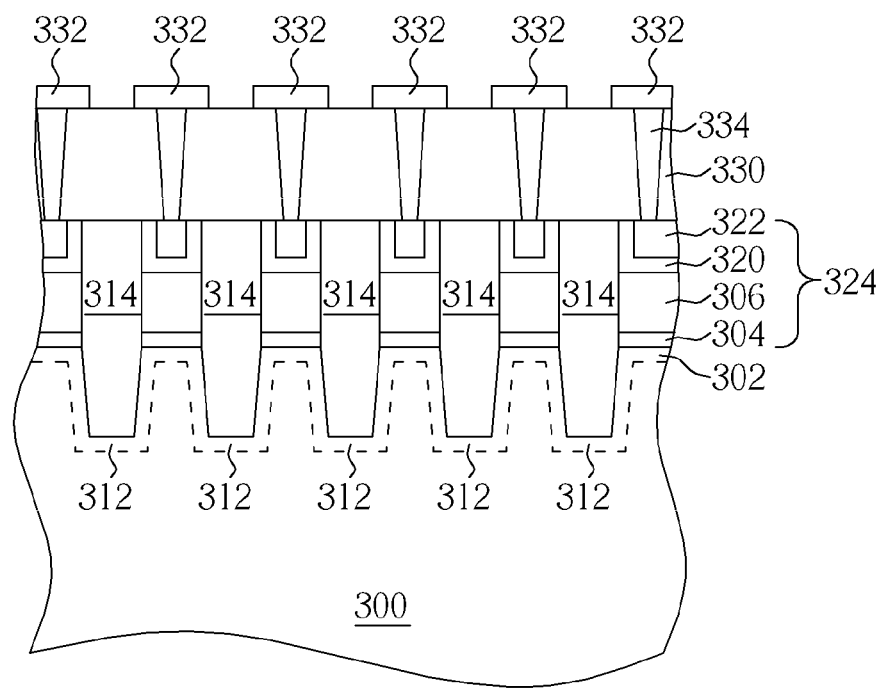

Please refer to FIG. 6. Then, a third dielectric layer 330, a plurality of contact plugs 334 and a second conductive layer 332 are sequentially formed on the substrate 300. The contact plugs 334 electrically connect the gate structures 324 to the second conductive layers 332, respectively.

Figure 7:
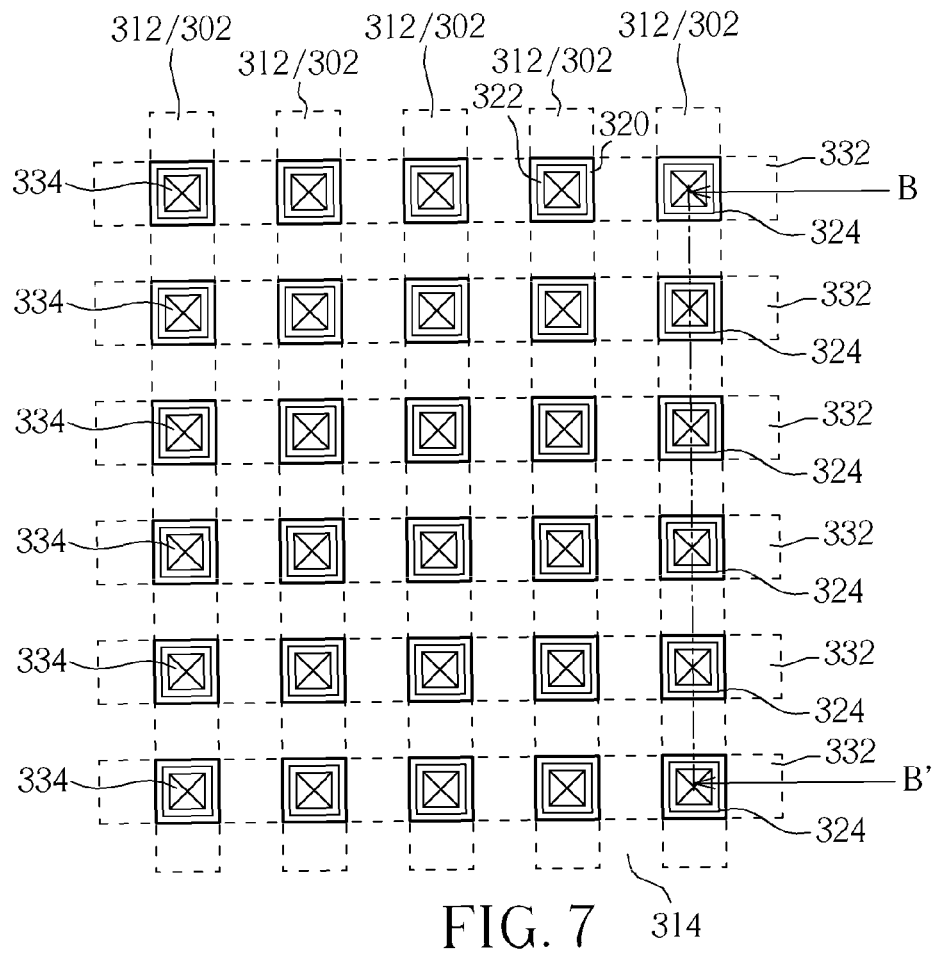

Please further refer to FIG. 7, which is a top plane view of the NAND memory cell array provided by the presented method and FIG. 6 is the cross-sectional view taken along a line B-B' of FIG. 7. In order to clearly show the islanding gate structures 324, the bit lines, which are constructed by the first doped region 302 and the second doped regions 312, and the second conductive layers 332, which serve as word lines in the present embodiment, are all shown in dashed lines.

Figure 8:
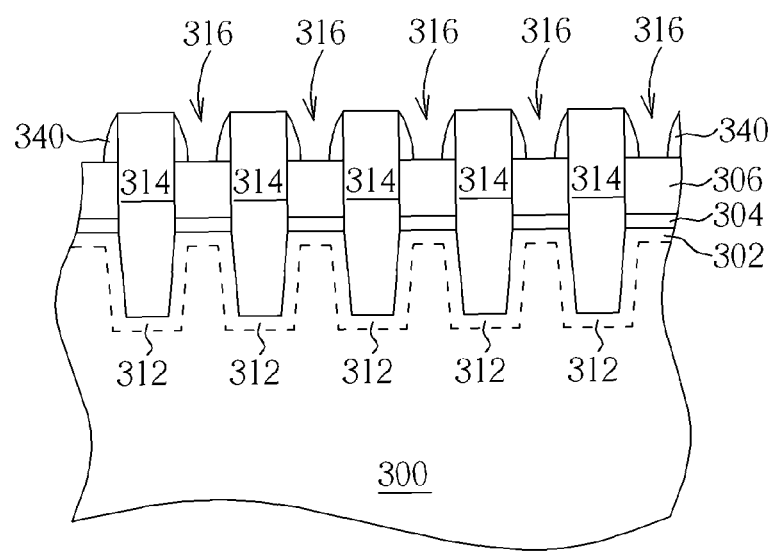
FIGS. 8-9 are schematic drawings illustrating a modification of the first preferred embodiment.
Figure 9:
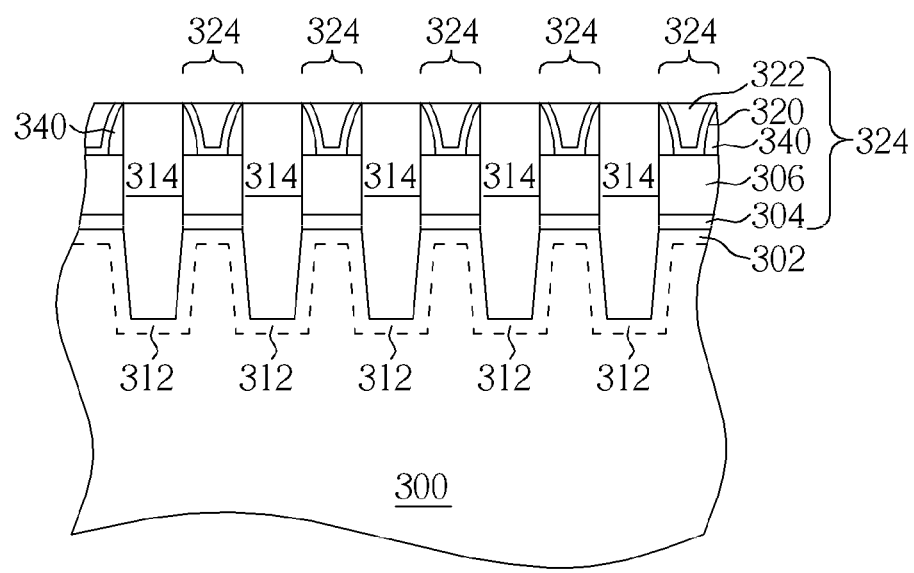

Please refer to FIGS. 8-9, which are schematic drawings illustrating a modification of the first preferred embodiment. Since some steps in the modification are similar with steps shown in FIGS. 1-3, those details and drawings are omitted herein. As shown in FIG. 8, a conductive layer preferably having the same material with the storage layer 306 is formed in the recesses 316, the conductive layer covers sidewalls and bottoms of the recesses 316. Then, an etching back process is performed to remove a portion of the conductive layer in the recesses 316 to form a plurality of conductive spacers 340 respectively in the recesses 316.

Please refer to FIG. 9. After forming the conductive spacers 340, the second dielectric layer 320 and the first conductive layer 322 filling the recesses 316 are formed on the substrate 300 and followed by performing the CMP process, thus the islanding gate structure 324 having a crown-shaped conductive spacer 340 formed on the storage layer 306 are obtained.

According to the present embodiment, the islanding gate structures 324 are obtained after the control-gate/select gate of the NAND memory cell is formed in self-aligned manner by the planarization process. Therefore the high grade photomask for defining the control-gate/select gate and the required alignment process are both economized. More important, the control-gate/select gate possesses a width similar with a width of the bit lines 302/312. Furthermore, the conductive spacers 340 provided by the modification is able to improve gate coupling ratio (GCR) and consequently improves the performance of the NAND memory cell.

Figure 10:
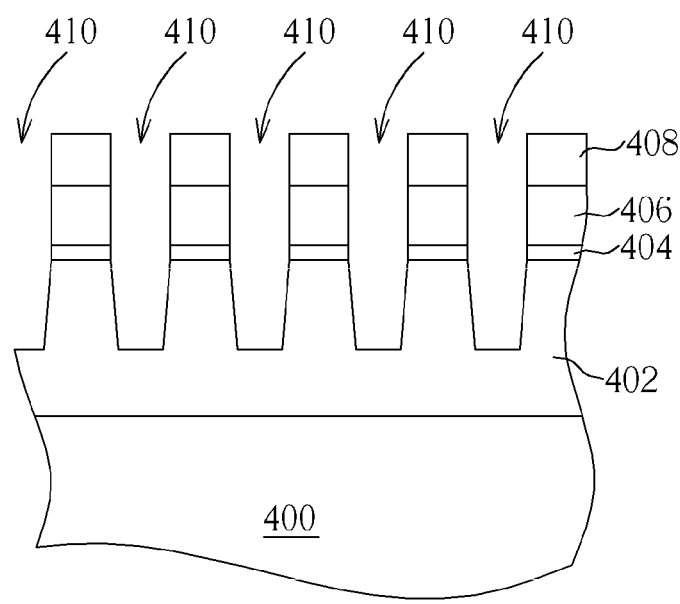
FIGS. 10-11 are schematic drawings illustrating the method for manufacturing NAND memory cells according to a second preferred embodiment of the present invention.
Figure 11:
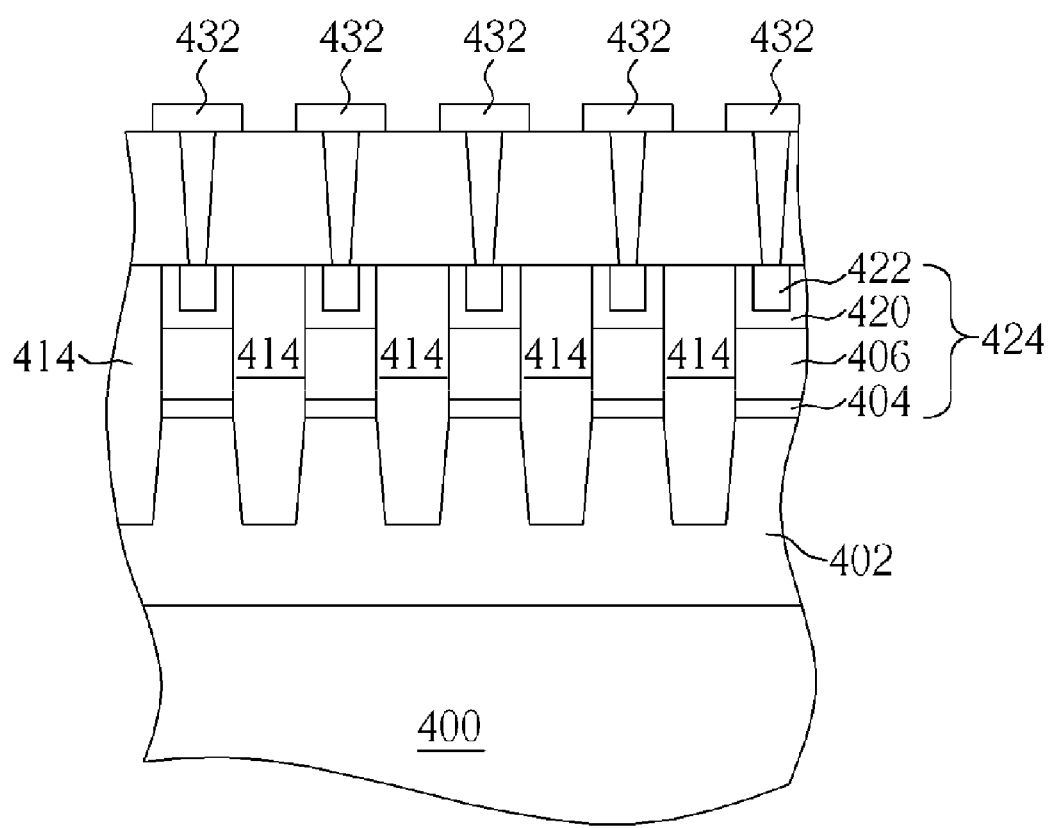

Please refer to FIGS. 10-11, which are schematic drawings illustrating the method for manufacturing NAND memory cells according to a second preferred embodiment of the present invention. As shown in FIG. 10, a semiconductor substrate 400, such as a silicon substrate or a SOI substrate, is first provided. The provided substrate 400 possesses a plurality doped regions 402 in a shape of stripes parallel to each other in the substrate 400. The doped regions 402 serving as bit lines of a NAND memory cell array are formed by a multi-implantation.

Please still refer FIG. 10. Then a first dielectric layer 404, a storage layer 406 and a patterned hard mask 408 are sequentially formed on the substrate 400. As mentioned above, the patterned hard mask 408 exemplarily possesses an islanding pattern. It is noteworthy that the materials used to form the abovementioned layers, thickness of the layers, or the methods for forming those layers are similar with those described in the first preferred embodiment.

Please refer to FIG. 10 again. A step of etching the storage layer 406, the first dielectric layer 404 and the substrate 400 is performed to form a shallow trench 410 in a grid pattern through the patterned hard mask 408. It is noteworthy that a depth of the shallow trench 410 is smaller than a depth of the doped region 402.

Please refer to FIG. 11. An insulating layer including a material similar with those described in the first preferred embodiment is formed filling the shallow trench 410 on the substrate 400. Then, a CMP is performed to remove a portion of the insulating layer to form a STI 414 with the patterned hard mask 408 serving as a polishing stop layer. After forming the STI 414, a step of removing the patterned hard mask 408 is performed. It is noteworthy that the STI 414 is formed to provide electrical isolation, and to define a plurality of recesses (not shown) in the substrate 400 after removing the patterned hard mask 408. Thus the storage layer 406 constructs bottoms of the recesses and the STI 414 constructs sidewalls of the recesses, as described in the first preferred embodiment. Furthermore, it should be noted the depth of the STI 414 is smaller than that of the doped regions 402. In other words, the STI 414 is formed without interrupting implant profiles of the doped regions 402 and the continuity of the bit lines.

Since the following steps and the modification of providing the conductive spacers are similar with those disclosed in the first preferred embodiment and as shown in FIGS. 4-6 and 8-9, the details are omitted hereinafter in the interest of brevity.

According to the second preferred embodiment, the bit lines are obtained when the doped regions 402 are formed by the multi-implantation, and since the STI 414 is formed without interrupting the implant profiles as shown in FIGS. 10 and 11, no further implantation is needed as disclosed in the first preferred embodiment. According to the second preferred embodiment, the high-grade photomask required to define the control-gate in the prior art is economized, and thus corresponding alignment processes are no longer in needed.

Please refer to FIGS. 6 and 11 again. According to the present invention, a NAND memory cell is provided. The NAND memory cell includes a substrate 300/400 having a STI 314/414 formed therein, an islanding gate structure 324/424, and a source/drain formed in the substrate 300/400 at two opposite sides of the islanding gate structure 324/424.

The islanding gate structure 324/424 includes a first dielectric layer 304/404, a storage layer 306/406, a second dielectric layer 320/420 and a conductive layer 322/422 sequentially stacked on the substrate 300/400. The source/drains electrically connect the NAND memory cells in a string in series. It is noteworthy that the islanding gate structure 324/424 is surrounded by the STI 314/414. And a top surface of the islanding gate structure 324/424 and a top surface of the STI 314/414 are substantially co-planar. Preferably, the top surface of the islanding gate structures 324/424 is a little higher than the top surface of the STI 314/414. It is noteworthy that the second doped region 402 serving as the bit line of the NAND memory cell can be made have a depth larger than that of the STI 414 as shown in FIG. 11.

Please refer to FIGS. 6 and 9. The second dielectric layer 320 can be an oxide-nitride-oxide multilayer and the storage layer 306 is a semiconductor layer. Thus the first dielectric layer 304 serves as the tunneling dielectric layer, the storage layer 306 serves as the floating-gate, the second dielectric layer 320 in multilayer manner serves as the intergate dielectric layer, and the first conductive layer 322 serves as the control-gate. When the NAND memory cell is programmed by a Fowler-Nordheim tunneling mechanism, the conductive layer 306 works as a medium for storing electrons generated from a junction between the source/drain 302/312 and penetrating the first dielectric layer 304 due to channel hot electron (CHE) effect. Furthermore, the provided NAND cell can further comprise a conductive spacer 340 exemplarily in crown shape formed on the storage layer 306 and covered by the second dielectric layer 320 for improving gate coupling ratio (GCR) as shown in FIG. 9.

The provided NAND memory cell also can be a silicon-oxide-nitride-oxide-silicon (SONOS) type NAND memory cell when the storage layer 306 is made of dielectric material, preferably a silicon nitride layer. The first dielectric layer 304 and the second dielectric layer 320 are preferably made of silicon oxide material. Thus the first dielectric layer 304, the storage layer 306 and the second dielectric layer 320 construct an oxide-nitride-oxide multi layer with the conductive layer 322 serving as the select gate of the SONOS cell. The storage layer 306 works as a storing medium for trapping electrons or hot holes when the SONOS type NAND memory cell is programmed by a source-side injection mechanism.

As mentioned above, the present invention provides a NAND memory cell have an islanding gate structure surrounded by the STI. More important, the conductive layer serving as control-gate or select gate of the NAND memory cell is formed in a self-aligned manner after performing the planarization process. Therefore no high-grade photomask for defining the control-gate/select gate is needed, and no alignment and patterning are needed either. And thus the undesired misalignment and unsuccessful patterning occur in the prior art and the resulting adverse influences are both fundamentally prevented. When the bit lines are formed by multi-implantation and the STI is formed with a depth smaller than that of the bit lines, one ion implantation can be further economized as mentioned above. Furthermore, the NAND memory cell possesses improved GCR when the conductive spacer is formed. Accordingly, the present invention provides improved NAND memory cells and competitive manufacturing method thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing NAND memory cells comprising steps of:
   providing a substrate having a first doped region formed therein;
   forming a first dielectric layer, a storage layer and a patterned hard mask on the substrate;
   forming a shallow trench isolation (STI) in the substrate through the patterned hard mask and removing the patterned hard mask to define a plurality of recesses;
   forming a second dielectric layer and a first conductive layer filling the recesses on the substrate; and
   performing a planarization process to remove a portion of the first conductive layer and the second dielectric layer to form a plurality of self-aligned islanding gate structures.

2. The method of claim 1, wherein the step of forming the STI further comprises:
   etching the storage layer, the first dielectric layer and the substrate to form a shallow trench through the patterned hard mask;
   forming an insulating layer filling the shallow trench on the substrate; and
   removing a portion of the insulating layer to form the STI.

3. The method of claim 2, wherein the first doped region is formed by a blanket implantation.

4. The method of claim 3 further comprising a step of performing an ion implantation to form a plurality of second doped regions in the substrate before forming the insulting layer.

5. The method of claim 4, wherein the first doped region and the second doped regions construct a plurality of bit lines parallel to each other.

6. The method of claim 1, wherein the first doped regions are parallel to each other.

7. The method of claim 6, wherein the first doped region is formed by a multi-implantation.

8. The method of claim 6, wherein a depth of the STI is smaller than a depth of the first doped regions.

9. The method of claim 1, wherein the first dielectric layer, the storage layer, and the patterned hard mask are sequentially formed on the substrate.

10. The NAND memory cell of claim 1, wherein the first conductive layer is formed after forming the second dielectric layer.

11. The method of claim 1 further comprising steps of forming third conductive layers and a plurality contact plugs electrically connecting the islanding gate structures to the third conductive layers, respectively.

12. The NAND memory cell of claim 1, wherein the first dielectric layer, the storage layer, and the second dielectric layer construct an oxide-nitride-oxide multilayer.

13. The NAND memory cell of claim 1, wherein the second dielectric layer is an oxide-nitride-oxide multilayer.

14. The NAND memory cell of claim 13, wherein the storage layer is a semiconductor layer.

15. The method of claim 14 further comprising steps of forming a plurality of conductive spacers respectively in the recesses before forming the second dielectric layer and the first conductive layer, the steps comprising:
   forming a second conductive layer in the recesses, the second conductive layer covering sidewalls and bottoms of the recesses; and
   performing an etching back process to remove a portion of the conductive layer in the recesses to form the conductive spacers.

* * * * *